(12) United States Patent
Kiyotoshi

(10) Patent No.: US 6,982,472 B2
(45) Date of Patent: Jan. 3, 2006

(54) SEMICONDUCTOR DEVICE AND CAPACITOR

(75) Inventor: Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/654,472

(22) Filed: Sep. 4, 2003

(65) Prior Publication Data

US 2004/0169255 A1 Sep. 2, 2004

(30) Foreign Application Priority Data

Feb. 28, 2003 (JP) .......................... 2003-053185

(51) Int. Cl.
*H01L 29/00* (2006.01)

(52) U.S. Cl. .......................... 257/532; 257/68; 257/71; 257/277

(58) Field of Classification Search .................. 257/68, 257/71, 277, 532
See application file for complete search history.

(56) References Cited

U.S. PATENT DOCUMENTS

| | | | | |
|---|---|---|---|---|
| 5,440,446 | A | * | 8/1995 | Shaw et al. ............... 361/301.5 |
| 6,251,720 | B1 | * | 6/2001 | Thakur et al. .............. 438/240 |
| 6,258,653 | B1 | * | 7/2001 | Chew et al. ................ 438/239 |
| 6,320,244 | B1 | | 11/2001 | Alers et al. ................. 257/534 |
| 6,551,896 | B2 | * | 4/2003 | Hosoda et al. .............. 438/396 |
| 6,794,240 | B2 | * | 9/2004 | Takehiro ..................... 438/240 |
| 6,830,983 | B2 | * | 12/2004 | Marsh ......................... 438/381 |

FOREIGN PATENT DOCUMENTS

| | | |
|---|---|---|
| JP | 07-058295 | 3/1995 |
| JP | 2000-082782 | 3/2000 |
| JP | 2000-183289 A | 6/2000 |
| JP | 2000-208720 A | 7/2000 |
| JP | 2002-222934 A | 8/2002 |

OTHER PUBLICATIONS

Notification of Reasons for Rejection (Office Action) for Japanese Patent Application No. 2003-053185, dated May 18, 2005 and English translation thereof.

* cited by examiner

*Primary Examiner*—Allan R. Wilson
(74) *Attorney, Agent, or Firm*—Finnegan, Henderson, Farabow, Garrett & Dunner, L.L.P.

(57) ABSTRACT

A semiconductor device comprises a semiconductor substrate and a capacitor provided above the semiconductor substrate, the capacitor comprises a lower electrode containing metal, a dielectric film containing tantalum oxide or niobium oxide, an upper electrode containing metal, and at least one of a lower barrier layer which is provided between the lower electrode and the dielectric film and an upper barrier layer which is provided between the upper electrode and the dielectric film, the lower barrier layer and the upper barrier layer being insulating layers which contain silicon and oxygen and containing the oxygen at least in a portion on a side contacting the dielectric film.

9 Claims, 9 Drawing Sheets

SEMICONDUCTOR DEVICE AND CAPACITOR

CROSS-REFERENCE TO RELATED APPLICATIONS

This application is based upon and claims the benefit of priority from the prior Japanese Patent Application No. 2003-053185, filed Feb. 28, 2003, the entire contents of which are incorporated herein by reference.

BACKGROUND OF THE INVENTION

1. Field of the Invention

The present invention relates to a semiconductor device including a capacitor, specifically an MIM (metal-insulator-metal) capacitor, and to a method of manufacturing the semiconductor device.

2. Description of the Related Art

In recent years, with advances in communication techniques, an increasing number of personal computers (PCs) and personal digital assistants (PDAs) have been connected to networks and used thereby. Also home-use electrical appliances (such as video decks, refrigerators, and air conditioners) are predicted to be connected to networks and to thereby be used in the future.

To configure a network with a large number of such devices as described above, a networking method used in, for example, offices in such a manner that LAN (local area network) cables are routed between individual devices is not suitable for use in ordinary homes, and it is considered that wireless connection using wireless services will be employed as mainstream connection in the future. As such, in the future, it is considered most LSI chips will have RF (radio frequency) communication functions added.

Conventionally, an LSI of the aforementioned type is formed of a plurality of chips, such as chips of RF analog devices (such as SiGe-BiCMOSs) and chips of CMOS logic devices. For PDAs and the like, miniaturization is viewed as important, and the LSI is demanded to be miniaturized using an RF-embedded LSI. In the RF-embedded LSI, an RF analog device and a CMOS logic device are integrated into a single chip.

To integrate the RF analog device and the CMOS logic device into a single chip, manufacturing processes for the two devices need to be integrated. The RF analog device is configured from, for example, resistors, inductances, and capacitors. The CMOS logic device is configured from a plurality of MOS transistors. As such, to realize the RF-embedded LSI, for example, a process for the RF analog device needs to be integrated with a CMOS logic process set as a base, and a new RF-CMOS process needs to thereby be developed.

In integration of the two processes, problems first arise regarding an MIM capacitor structure and the process thereof. The reasons for this are described hereunder.

One of a feature of the MIM capacitor for the RF analog device in the RF-embedded LSI is the capacitor area is as large as several hundred square microns. As such, increasing the capacitor capacitance per unit area is very important for decreasing the chip size and for increasing Q values of circuits.

In addition, good pairability is required for MIM capacitors for the RF analog device for the reason described hereunder. The RF analog circuit includes an arithmetic circuit that obtains output differentials by using symmetric circuits. In this configuration, capacitors used in pairs in the arithmetic circuit are required to match one another in capacitance and responsibility with very high accuracy.

Conventionally, in order to increase the capacitance density of an MIM capacitor having a large area, a technique is used for a capacitor of a DRAM in which an electrode is three-dimensionally structured, and the side wall area of the capacitor is thereby increased. However, the method is not effective for the reasons described hereunder.

An area (S1) of a DRAM capacitor in a top view is very small. As such, in the case where an electrode is three-dimensionally structured to increase a side wall area (S2), the ratio of S2/S1 increases to be very high. For this reason, for the DRAM capacitor, the capacitance density can easily be increased by three-dimensionally structured the electrode.

However, compared with the DRAM capacitor, the capacitor used for the RF-embedded LSI has a very large area S1. As such, even when S2 is enlarged to a certain extent, the ratio of S2/S1 is not increased so much. Suppose the ratio of S2/S1 is to be sufficiently increased in the simple way that the electrode is formed columnar. In this case, the electrode needs to be as tall as several tens of microns. However, such a tall electrode is impractical.

To increase S2 without using such a tall electrode, a technique for forming a large number of fine raggedness portions on sidewalls of an electrode. However, when such an electrode having such an intricate shape, it is difficult to realize an MIM capacitor having good pairability.

Another conceivable technique for increasing the capacitance density without forming the three-dimensional electrode structure is that a high-permittivity material, such as tantalum oxide ($Ta_2O_5$) niobium oxide ($Nb_2O_5$), or barium titanate is used instead of conventionally used silicon nitride as a material for the dielectric film of the MIM capacitor. (The high-permittivity material is disclosed in, for example, Jpn. Pat. Appln. KOKAI Publication Nos. 2000-183289 and 2000-208720.)

BRIEF SUMMARY OF THE INVENTION

A semiconductor device according to an aspect of the present invention comprises a semiconductor substrate; and a capacitor provided above the semiconductor substrate, the capacitor comprises a lower electrode containing metal; a dielectric film containing tantalum oxide or niobium oxide; an upper electrode containing metal; and at least one of a lower barrier layer which is provided between the lower electrode and the dielectric film and an upper barrier layer which is provided between the upper electrode and the dielectric film, the lower barrier layer and the upper barrier layer being insulating layers which contain silicon and oxygen and containing the oxygen at least in a portion on a side contacting the dielectric film.

A semiconductor device according to another aspect of the present invention comprises a semiconductor substrate; and a capacitor provided above the semiconductor substrate, the capacitor comprises a lower electrode containing metal; a dielectric film containing tantalum oxide or niobium oxide; an upper electrode containing metal; and at least one of a lower barrier which is provided between the lower electrode and the dielectric film and an upper barrier layer which is provided between the upper electrode and the dielectric film, the lower barrier layer being insulating layer which contains silicon and nitrogen and containing the nitrogen at least in a portion on a side contacting the lower electrode, the upper barrier layer being insulating layer which contains silicon and nitrogen and containing the nitrogen at least in a portion on a side contacting the upper electrode.

A semiconductor device according to another aspect of the present invention comprises a semiconductor substrate; and a capacitor provided above the semiconductor substrate, the capacitor comprises a lower electrode containing metal; a dielectric film containing tantalum oxide or niobium oxide; an upper electrode containing metal; and at least one of a lower barrier layer which is provided between the lower electrode and the dielectric film and an upper barrier layer which is provided between the upper electrode and the dielectric film, the lower barrier layer being insulating layer which contains silicon, oxygen and nitrogen, containing the nitrogen at least in a portion on a side contacting the lower electrode and containing the oxygen in a portion on a side contacting the dielectric film, the upper barrier layer being insulating layer which contains silicon, oxygen and nitrogen, containing the nitrogen at least in a portion on a side contacting the upper electrode and containing the oxygen in a portion on a side contacting the dielectric film.

A method of manufacturing a semiconductor device according to an aspect of the present invention comprises preparing a semiconductor substrate; and forming a capacitor above the semiconductor substrate, the capacitor comprising a lower electrode containing metal, a dielectric film containing tantalum oxide or niobium oxide, an upper electrode containing metal, and at least one of a lower barrier layer and an upper barrier layer, forming the capacitor comprises forming a first conductive film containing the metal to be processed into the lower electrode; forming the dielectric film contacting the first conductive film directly or via the lower barrier layer; and forming a second conductive film containing the metal to be processed into the upper electrode, the second conductive film contacting the dielectric film directly or via the upper barrier layer, and forming the upper barrier layer comprises forming a first upper insulating layer containing silicon and oxygen on the dielectric film by a reactive sputtering process with a sputtering target containing silicon in an atmosphere containing oxygen; and forming a second upper insulating layer containing silicon and nitrogen on the dielectric film by a reactive sputtering process with a sputtering target containing silicon in the atmosphere where the oxygen is replaced with nitrogen.

DETAILED DESCRIPTION OF THE INVENTION

Figure 1A:
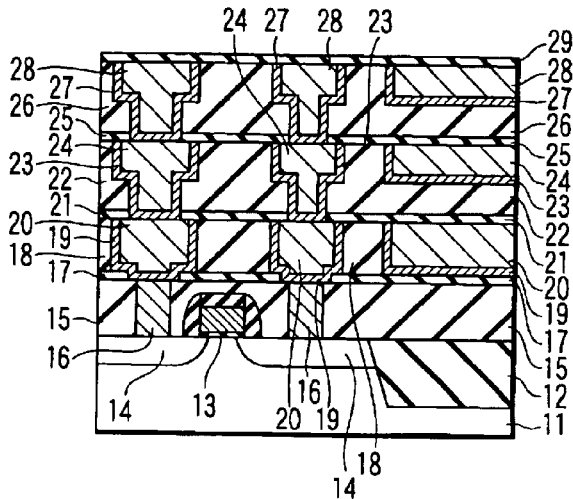
FIGS. 1A to 1F are cross-sectional views showing manufacturing steps for a semiconductor device including an MIM capacitor according to a first embodiment of the present invention.

First, a description will be provided regarding the results of research, investigations, and the like carried out by the present inventor, based on which the present invention has been developed.

As has been described above, the technique can be considered in which the high-permittivity material, such as tantalum oxide ($Ta_2O_5$) or niobium oxide ($Nb_2O_5$), is used as a material for the MIM capacitor to increase the capacitance density without forming the three-dimensional electrode structure.

Particularly, the tantalum oxide is an optimum material to realize a capacitor with a low leakage current and a high capacitance density. A reason for this is that the tantalum oxide exhibits a high permittivity of about 30 even in an amorphous state. Another reason is that the crystallizing temperature of the tantalum oxide is as high as approximately 700° C. (generally, when a high-permittivity material crystallizes, it produces an increased leakage current).

Tantalum and niobium mutually resemble closely in physical properties and chemical properties and have relatively high resistance against oxidization. As such, suppose an MIM capacitor is formed using a dielectric material of either the tantalum oxide or the niobium oxide (which hereinbelow will be referred to as "$(Ta,Nb)_2O_5$" to prevent complexity in the description) and an electrode material of either a conventionally used titanium nitride (TiN) or tantalum nitride (TaN). In this case, the dielectric film reacts with the electrode, and $(Ta,Nb)_2O_5$ is thereby reduced. Particularly, $(Ta,Nb)_2O_5$ is reduced in a portion near the interface between the dielectric film and the electrode.

Upon reduction occurs in $(Ta,Nb)_2O_5$, an oxygen deficiency or vacancy acting as a divalent donor is formed. When a large number of oxygen vacancies are formed, problems (1) to (4) described below occur, thereby diminishing the MIM capacitor characteristics.

(1) A deficiency level is generated resulting from oxygen vacancies with $(Ta,Nb)_2O_5$ in a near-interface portion between the dielectric film and the electrode. This inhibits formation of an appropriate schottky barrier over the interface between the dielectric film and the electrode, thereby increasing leakage current. In such an event an appropriate schottky barrier is not formed over the interface, a rise in operation temperature allows leakage current to sharply increase. This causes the circuit operation to be difficult in a high temperature range of approximately from 100 to 125°

C. at which operational guarantee is required for, for example, mobile apparatuses.

(2) When the circuit operation temperature has risen, electrons trapped at the oxygen deficiency or vacancy is thermally excited. Thereby, the electrons are caused to be easily movable, and $(Ta,Nb)_2O_5$ becomes easily polarizable. As such, a capacitance of $(Ta,Nb)_2O_5$ containing many oxygen vacancies exhibits a high temperature dependency, that is, a high TCC (temperature coefficient of capacitance). Consequently, an MIM capacitor using $(Ta,Nb)_2O_5$ as described above does not lend itself to analog circuits.

(3) Since electrons trapped at the oxygen deficiency or vacancy are strongly constrained by an oxygen deficiency or vacancy potential, even when a low electric field is applied, $(Ta,Nb)_2O_5$ does not lend itself to contribution to the polarization. With a high electric field being applied, however, since the electrons are relieved of constraints of oxygen potential, the capacitor of $(Ta,Nb)_2O_5$ is made to contribute to the capacitance of $(Ta,Nb)_2O_5$. In this case, approximately with respect to the electric field, the capacitance of $(Ta,Nb)_2O_5$ increases quadratically. That is, $(Ta,Nb)_2O_5$ exhibits a high VCC2 (quadratic voltage coefficient of capacitance) ($C=C_0(1+VCC2\times V^2)$). A circuit including an MIM capacitor using $(Ta,Nb)_2O_5$ as described above lends itself to introduction of erroneous operation. This is particularly true of a circuit such as an A/D converter for which linearity of accumulate charge with respect to the voltage is required.

(4) A lower electrode/dielectric film interface condition and an upper electrode/dielectric film interface condition frequently tend to be different from one another. This is because the lower electrode/dielectric film interface tends to have an influence (such as oxidization) at the time of $(Ta,Nb)_2O_5$ formation, whereas the upper electrode/dielectric film interface does not have such an influence. Hence, internal electric fields occur within $(Ta,Nb)_2O_5$ when a deficiency level is generated in $(Ta,Nb)_2O_5$ in a near-interface portion between the dielectric film and the electrode, electrons are trapped at the deficiency level, and the electrons act as fixed charges. In the state where the aforementioned internal electric fields have occurred, when a voltage is applied to the capacitor, effective electric fields given to the electrons in $(Ta,Nb)_2O_5$ are different on the side of the lower electrode and on the side of the upper electrode. Hence, the capacitance of $(Ta,Nb)_2O_5$ is caused not to produce responses symmetric with respect to positive and negative bias voltages. Specifically, $(Ta,Nb)_2O_5$ exhibits a high VCC1 (linear voltage coefficient of capacitance) ($C=C_0(1+VCC1\times V)$). A MIM capacitor using $(Ta,Nb)_2O_5$ as described above lends itself to introduction of erroneous operation, reduction of the SN ratio, and reduction of the Q value.

In order to solve the above-described problems (1) to (4), a configuration can be considered in which a barrier layer not reacting with the electrode material is inserted between the electrode (TaN,TiN) and the dielectric film ($(Ta,Nb)_2O_5$).

The material for the barrier layer of this type may be a material having a permittivity of approximately between 10 and 20, such as an $Al_2O_3$, $HfO_2$, or $ZrO_2$ material. In this case, since the reaction between the electrode and the dielectric film can be suppressed without introducing an extreme loss of capacitance, an MIM capacitor not allowing leakage current beyond a very small leakage current can be realized.

The work function of niobium oxide is greater than that of tantalum oxide. For this reason, niobium oxide being used as the dielectric material does not lend itself to formation of an appropriate schottky barrier on the dielectric film/electrode interface. However, since the barrier layer formed using the material described above is inserted between the dielectric film and the electrode, a case similar to the case where tantalum oxide is used as the dielectric material; that is, an MIM capacitor with a small leakage current can be realized.

As a result extensive research and studies carried out by the present inventor, a very low leakage current, which is very low even when measured at 100° C., was surely attained by insertion of the barrier layer between the dielectric film and the electrode. However, the VCC2 and TCC of the MIM capacitor indicated values that are as high as several hundreds of ppm.

The present inventor investigated the VCC2 and the TCC of the material itself of the barrier layer. The investigation results are shown in Table 1.

TABLE 1

|  | $Ta_2O_5$ | SiN | $Al_2O_3$ | $HfO_2$ | $ZrO_2$ |
|---|---|---|---|---|---|
| Permittivity [ε 0] | 30 | 7.5 | 11 | 25 | 25 |
| VCC2[ppm] | 30 | 22 | 300 | 250 | 350 |
| TCC[ppm] | 40 | 38 | 200 | 220 | 250 |

As seen from Table 1, $Al_2O_3$, $HfO_2$, and $ZrO_2$ each exhibit a TCC and a VCC2 that are significantly greater (one decimal place or greater) than silicon nitride and tantalum oxide.

The above mentioned silicon nitride is formed using a PECVD (plasma enhanced chemical vapor deposition) process, it is not a dielectric of which the ratio of Si and N is not limited to 1:1.

A capacitance of an MIM capacitor using a barrier layer formed of a material such as $Al_2O_3$ exhibits high TCC and VCC2 for the reason that the MIM capacitor is a combined capacitance formed of a tantalum oxide film and the barrier layer film. Hence, this type of MIM capacitor is not suitable for an analog device.

The present inventor conducted researches and investigation regarding an MIM capacitor having a multilayered structure formed of a barrier layer (SiN), a dielectric film ($Ta_2O_5$), and a barrier layer (SiN). This multilayered structure is formed using tantalum oxide as the dielectric material and silicon nitride as the barrier material. Tantalum oxide used therein has low TCC and VCC2, and silicon nitride used therein is practically proven as a material for analog-device capacitors. As a result of the research and investigation, the MIM capacitor was found to have the following problems (1) and (2):

(1) The barrier layer, which is formed of the silicon nitride material by using a PECVD process, contains much hydrogen. As such, the dielectric film (tantalum oxide film) is reduced by hydrogen or hydrogen radicals in an ambient in which the barrier layer is formed or by hydrogen radicals dissipated from the inside of the barrier layer in a heating step after the MIM capacitor has been formed. Consequently, the characteristics of the TCC and VCC2 are degraded.

(2) When silicon nitride used as an upper barrier layer is formed by a sputtering process, Si atoms are somewhat implanted into the dielectric film (tantalum oxide film). Hence, after a heating process, tantalum oxide of a barrier layer/dielectric layer interface is reduced in the MIM capacitor that uses a silicon nitride film formed by the sputtering process as a barrier layer (upper barrier layer) between the dielectric film and the upper electrode. This results in increasing the leakage current. The heating process is, for example, a plasma CVD process for forming interlayer dielectric (ILD) films and a sintering annealing process for improving the transistor characteristics.

Hereinbelow, referring to the drawings, a description will be provided regarding MIM capacitors according to embodiments of the present invention. The MIM capacitors have high capacitance density and are capable of solving the problems described above.

(First Embodiment)

FIGS. 1A to 1F are cross-sectional views showing manufacturing steps for a semiconductor device including an MIM capacitor according to a first embodiment of the present invention.

An upper electrode and a lower electrode of the MIM capacitor are individually titanium nitride films formed by a sputtering process, and a dielectric film is a tantalum oxide film formed by a CVD process. A multilayer barrier layer including a SiN layer and a SiO layer is provided between the dielectric film and the upper electrode.

In this embodiment, the name "SiO layer (SiO)" refers to an insulating layer (insulator) composed of Si and O as primary elements, and the name "SiN layer" refers to an insulating layer (insulator) composed of Si and N as primary elements; and these names do not represent composition ratios of substances. (This applies also to other embodiments).

The method of manufacturing the MIM capacitor according to the present embodiment will be described in detail hereinbelow.

FIG. 1A depicts a silicon substrate including well-known MOS transistors, isolation region, and multilayer wiring layers. In the present embodiment, an MIM capacitor is fabricated over the multilayer wiring layer shown in FIG. 1A.

The MIM capacitor of the present embodiment is, for example, a capacitor for an analog circuit. Specifically, the MIM capacitor is an analog circuit including an RF circuit (such as a noise filter of an RF receiving section). The RF circuit is provided in a RF-embedded LSI.

The well-known structure shown in FIG. 1A is formed by well-known standard logic processes. Processes for forming the structure shown in FIG. 1A will briefly be described hereinbelow.

First, a device-isolating region (STI: Shallow Trench Isolation) 12, a gate electrode section (a gate insulating film, a gate electrode, a gate-upper-portion insulating film, and a gate-sidewall insulating film) 13, and source/drain regions 14 are formed on a silicon substrate 11. Thereafter, an interlayer dielectric film 15 is deposited on the entire surface of the substrate, and the surface of the device face is then planarized. The source/drain regions 14 have an LDD (lightly doped drain) structure, however, the LDD structure is not shown in the figure.

Subsequently, the interlayer dielectric film 15 is etched off, and contact holes are thereby formed. Then, plugs 16 are individually formed in the contact holes 16.

Subsequently, a silicon nitride film 17 and an interlayer dielectric film 18 are sequentially formed over the entire surface of substrate. Then, the interlayer dielectric film 18 and the silicon nitride film 17 are etched, and via-holes are thereby opened. Thereafter, using dual damascene processing, barrier metal films 19 and wirings and plugs 20 (DD (dual damascene) wirings) are individually formed into the via-holes. In this manner, a first metal wiring layer can be obtained. The barrier metal film 19 is, for example, a titanium nitride film; and the DD wiring 20 is, for example, a Cu-DD wiring. In the processing for the individual DD wirings, an filling step with metals in wiring recesses and contact-holes is performed by, for example, electroplating processing.

After the above, in a manner similar to that for the first metal wiring layer, a silicon nitride film 21, an interlayer dielectric film 22, barrier metal films 23, DD wirings 24, a silicon nitride film 25, an interlayer dielectric film 26, barrier metal films 27, DD wirings 28, and a silicon nitride film 29 are formed. Thereby, a second metal wiring layer and a third metal wiring layer can be obtained.

Figure 1B:
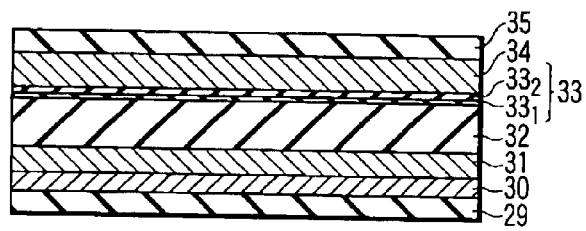

Subsequently, as shown in FIG. 1B, a titanium film 30 and a titanium nitride film 31 that are used as the lower electrodes are formed by sputtering process over the silicon nitride film 29.

Subsequently, as shown in FIG. 1B, a tantalum oxide film 32 having a thickness of 60 nm is formed over the titanium nitride film 31. A deposition technique for the tantalum oxide film 32 is either a CVD process or a reactive sputtering process. Hereinbelow, the tantalum oxide film 32 formed by a CVD process is referred to as a "CVD-$Ta_2O_5$ film," and the tantalum oxide film 32 formed by a reactive sputtering process is referred to as a "sputter-$Ta_2O_5$ film." Deposition conditions of the CVD-$Ta_2O_5$ film are described hereunder. The deposition temperature is 370° C., the deposition pressure is 80 Pa, source materials are pentaethoxyltantalum (PET) and oxygen, PET in a liquid phase is supplied, and He gas is used as a carrier gas. Every 20 nm of a tantalum oxide film is formed, processing using ozone gas is performed for 10 minutes, and carbon impurities in the tantalum oxide film are thereby removed. The carbon impurities occur from the source materials remaining in the tantalum oxide film. By repeating this sequence three times, the CVD-$Ta_2O_5$ film is formed to a thickness of 60 nm for use as the tantalum oxide film 32.

Deposition conditions of the sputter-$Ta_2O_5$ film are as described hereunder. The sputtering target is a tantalum metal target, the sputtering device is of a DC type, the deposition temperature is 200° C., the process gas is a mixed gas of Ar and $O_2$, the Ar/$O_2$ flow ratio is 1.3, and the sputtering power is 1.0 kW.

Subsequently, as shown in FIG. 1B, an upper barrier layer 33 having a multilayered structure is formed by a reactive sputtering process over the tantalum oxide film 32. The upper barrier layer 33 includes a 0.4 nm thick SiO layer $33_1$ and a 1.5 nm thick SiN layer $33_2$ provided on the SiO layer $33_1$.

Deposition conditions of the upper barrier layer 33 are as described hereunder. An un-doped silicon target is used as a sputtering target, the deposition temperature is a room temperature, and the sputtering power is 0.8 kW. A mixed gas of Ar and $O_2$ is used as a process gas for the SiO layer $33_1$, and the flow ratio (Ar/$O_2$) of the process gas is 1.2. A process gas for the SiN layer $33_2$ is a mixed gas of Ar and $N_2$, and the flow ratio (Ar/$N_2$) is 0.93.

Thus, an advantage of using the sputtering technique as the deposition technique for a barrier layer is that the barrier-layer deposition temperature can be relatively low. Hence, a high-quality barrier layer can be formed even at a low temperature not influencing the multilayer wiring layers.

Subsequently, as shown in FIG. 1B, a titanium nitride film 34 used as the upper electrode is continually formed by a sputtering process over the upper barrier layer 33 in the same sputtering device used to form the upper barrier layer 33.

Thereafter, a silicon nitride film 35 is formed by a PECVD process over the titanium nitride film 34. The upper barrier layer 33 and the titanium nitride film 34 are thus continually formed in the same sputtering device.

Figure 1C:
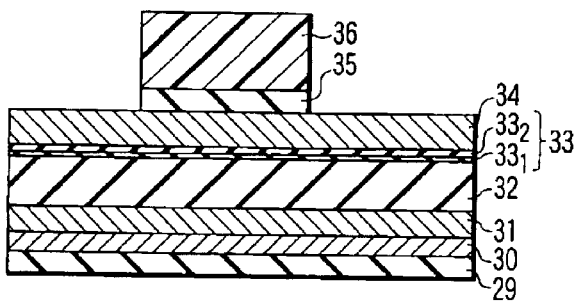

Subsequently, as shown in FIG. 1C, a resist pattern 36 is formed over the silicon nitride film 35. Then, with the resist pattern 36 being used as a mask, the silicon nitride film 35 is etched off. Thereby, a pattern of the resist pattern 36 is transferred onto the silicon nitride film 35. Thereafter, the resist pattern 36 is removed by ashing.

Figure 1D:
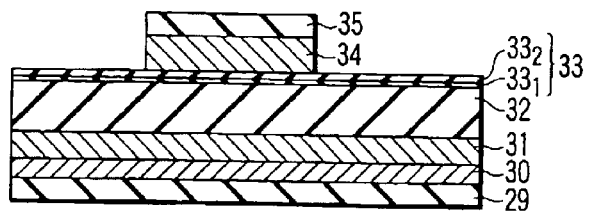

Subsequently, as shown in FIG. 1D, with the silicon nitride film 35 (hard mask) being used as a mask, the titanium nitride film 34 is etched off by an RIE (reactive ion etching) process using a fluorine-based etching gas. Thereby, an upper electrode (titanium nitride film) 34 having a predetermined (designed) shape is obtained.

Figure 1E:
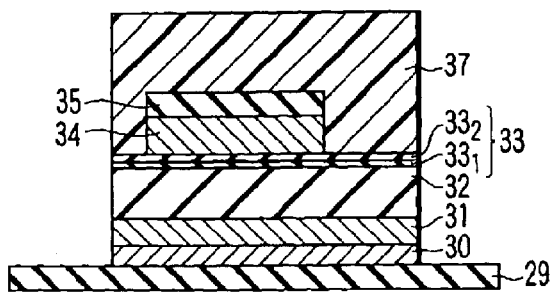

Subsequently, as shown in FIG. 1E, a resist pattern 37 is formed over the silicon nitride film 35 and the upper barrier layer 33. Thereafter, with the resist pattern 37 being used as a mask, the upper barrier layer 33, the tantalum oxide film 32, the titanium nitride film 31, and the titanium film 30 are sequentially etched off. Thereby, the upper barrier layer 33, the tantalum oxide film 32, and the lower electrodes 30 and 31, individually having predetermined shapes, are obtained. Thereafter, the resist pattern 37 is removed by ashing.

Figure 1F:
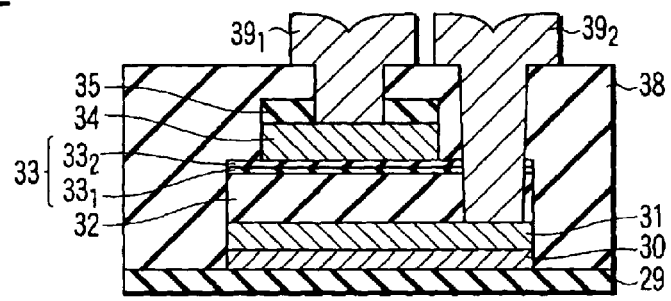

The steps described above complete a basic structure of the MIM capacitor. Thereafter, as shown in FIG. 1F, well-known steps follow. The steps to follow are, for example, a step of forming an interlayer dielectric film 38 over the entire surface of the substrate, a step of forming a lead-out electrode $39_1$ of the upper electrode 34 and a lead-out electrode $39_2$ of the lower electrode 31, and a step of forming a passivation film and the like.

Figure 2:
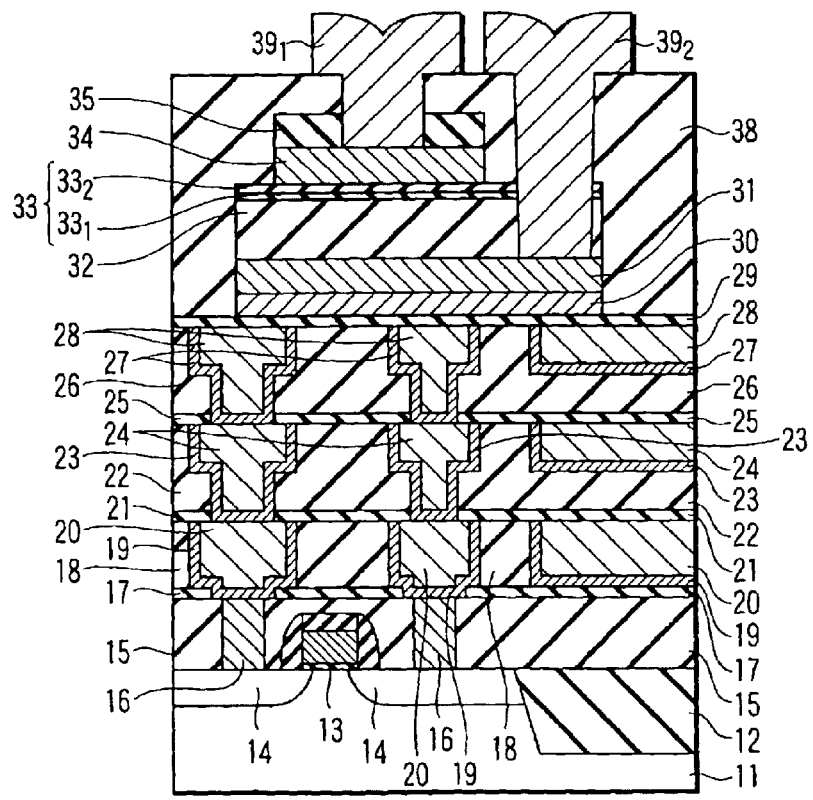
FIG. 2 is a cross-sectional view showing a semiconductor device including the MIM capacitor according to the first embodiment of the present invention.
Figure 3A:
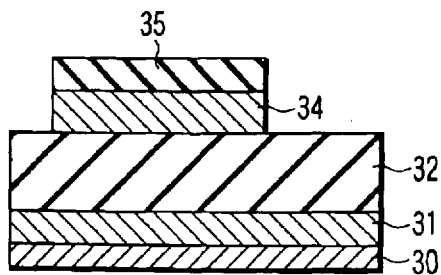
FIGS. 3A to 3D are cross-sectional views individually showing MIM capacitors of comparative examples 1 to 4.
Figure 3C:
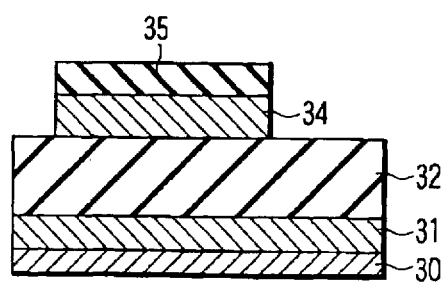
Figure 3B:
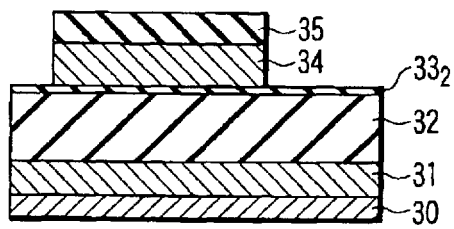
Figure 3D:
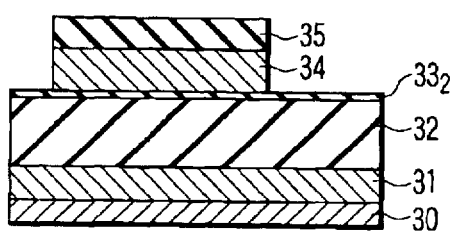

For the interlayer dielectric film 38, generally, a dielectric film having a low permittivity, which is so-called a "low-k film", is used. A semiconductor device of the present embodiment, which has been obtained through the steps described above, is shown in FIG. 2 in the form of a cross-sectional view.

The lead-out electrodes $39_1$ and $39_2$ are formed by processes described hereunder in detail. First, the interlayer dielectric film 38, the silicon nitride film 35, the upper barrier layer 33, and the tantalum oxide film 32 are etched off using a photolithography process and an RIE process. Thereby, a first contact hole and a second contact hole communicating respectively with the upper electrode 34 and the titanium nitride film 31 are formed. The RIE process uses a fluorine-based etching gas.

Subsequently, an aluminum film is formed by a sputtering process over the entire surface of the substrate so as to fill the insides of the first and second contact holes. The aluminum film is then processed by a photolithography process and an RIE process. Thus, the lead-out electrodes $39_1$ and $39_2$ formed of the aluminum film can be obtained.

According to the present embodiment, as described below, even with the tantalum oxide film 32 being used as the dielectric film of the MIM capacitor, no inconveniences take place. Accordingly, a semiconductor device enabling an increase in the capacitance density of an MIM capacitor and a manufacturing method therefor can be easily implemented.

As described above, the upper barrier layer 33 (SiN layer $33_2$/SiO layer $33_1$) is provided between the tantalum oxide film 32 and the upper electrode (titanium nitride film) 34. Therefore, the reduction due to the upper electrode (titanium nitride film) 34 for the tantalum oxide film 32 is suppressed.

In the upper barrier layer 33, the SiO layer $33_1$ is used for the portion contacting the tantalum oxide film 32. This works to suppress the reduction of the tantalum oxide film 32 due to free silicon atoms in the upper barrier layer 33.

According to the above, an MIM capacitor producing a low leakage current, a low VCC2, and a low TCC can be realized.

In the upper barrier layer 33, the SiN layer $33_2$ is used for the portion contacting the upper electrode (titanium nitride film) 34. This suppresses oxidation of the upper electrode (titanium nitride film) 34 due to the SiO layer $33_1$. The oxidation causes increase in the leakage current and deterioration in the reliability.

In addition, in the upper barrier layer 33, the SiN layer $33_2$ not containing oxygen is used for the portion contacting the upper electrode. Hence, the material of the upper electrode is not limited to the titanium nitride used in the present embodiment, and a material for which oxidation resistance is not required can be used. For example, aluminum or copper that has been conventionally used as a multilayer-wiring material can be used. Since these materials have a lower resistance than the titanium nitride, the Q value of the circuit can further be increased. For example, the structure using Cu enables the Q value to be approximately two times higher than in the case where the titanium nitride is used.

Consequently, an MIM capacitor with a low leakage current and a high capacitance density can easily be realized (the capacitance density of the MIM capacitor of the present embodiment was 3.0 $fF/\mu m^2$). Thereby, the size of an RF-embedded LSI chip, which is predicted to be mounted in any devices in the future, can be reduced. Consequently, miniaturization of the devices can be implemented.

As comparative examples 1 to 4 (references), the present inventor prepared four MIM capacitors shown in FIGS. 3A to 3D. In the MIM capacitors of comparative examples 1 to 4, portions corresponding to those of the MIM capacitor of the present embodiment are shown with the same reference numerals as those used in the present embodiment. Portions corresponding to the silicon nitride film 29, the interlayer dielectric film 38, and the lead-out electrodes $39_1$ and $39_2$ are omitted for simplification.

COMPARATIVE EXAMPLE 1

(FIG. 3A) is an MIM capacitor in which the CVD-$Ta_2O_5$ film is used as the tantalum oxide film 32, and the upper barrier layer 33 ($33_1$ and $33_2$) is removed from the MIM capacitor of the present embodiment.

COMPARATIVE EXAMPLE 2

(FIG. 3B) is an MIM capacitor in which the CVD-$Ta_2O_5$ film is used as the tantalum oxide film 32, the SiO layer $33_1$ is removed from the MIM capacitor of the present embodiment, and a monolayer barrier layer (SiN layer $33_2$) is used. The monolayer barrier layer is formed to a thickness of 1.9 nm.

COMPARATIVE EXAMPLE 3

(FIG. 3C) is an MIM capacitor in which the sputter-$Ta_2O_5$ film is used as the tantalum oxide film 32, and upper barrier layer 33 ($33_1$ and $33_2$) is removed from the MIM capacitor of the present embodiment.

COMPARATIVE EXAMPLE 4

(FIG. 3D) is an MIM capacitor in which the sputter-$Ta_2O_5$ film is used as the tantalum oxide film 32, the SiO layer $33_1$ is removed, and a monolayer barrier layer (SiN layer $33_2$) is used. The monolayer barrier layer is formed to a thickness of 1.9 nm.

Table 2 shows VCC1, VCC2, and TCC values and leakage-current values of the MIM capacitors of the comparative examples 1 to 4 and the present embodiment in the cases where bias voltages (±1.0 V and ±3.6 V) are applied at 100° C. In the case of +1.0 V and +3.6 V (positive bias voltages), the lower electrode side is positive (+), and the upper electrode side is negative (−); and in the case of −1.0 V and −3.6 V (negative bias voltages), the lower electrode side is negative (−), the upper electrode side is positive (+).

The sputter-$Ta_2O_5$ film is formed by a reactive sputtering process using a high-purity metal tantalum target. For this reason, the carbon impurity concentration of the sputter-$Ta_2O_5$ film is sufficiently low.

In comparison, the CVD-tantalum oxide film is formed by a CVD (MOCVD (metal-organic chemical vapor deposition)) process, which uses an organic metal compound as a source gas. Hence, the tantalum oxide film contains a carbon impurity of about 1%. This is because as

TABLE 2

| | | TCC | VCC1 | VCC2 | Leakage Current [A/mm$_2$ Measurement Values at 100° C.] | | | |
|---|---|---|---|---|---|---|---|---|
| | | [ppm] | [ppm] | [ppm] | +3.6 V | +1.0 V | −1.0 V | −3.6 V |
| CVD-$Ta_2O_5$ | Without Barrier (Comparative Example 1) | 460 | 650 | 290 | 5.30E−06 | 1.20E−10 | 2.10E−10 | 4.90E−06 |
| | SiN Barrier (Comparative Example 2) | 120 | 130 | 89 | 2.20E−10 | 5.10E−11 | 3.50E−09 | 3.20E−06 |
| | Multilayer Barrier (Embodiment) | 48 | 47 | 46 | 9.20E−11 | 6.40E−11 | 6.20E−11 | 8.00E−11 |
| Sputter-$Ta_2O_5$ | Without Barrier (Comparative Example 3) | 530 | 900 | 310 | 5.20E−06 | 1.80E−10 | 2.50E−10 | 5.10E−06 |
| | SiN Barrier (Comparative Example 4) | 160 | 170 | 95 | 2.10E−10 | 3.50E−11 | 2.00E−09 | 3.80E−06 |
| | Multilayer Barrier (Embodiment) | 99 | 150 | 78 | 4.50E−11 | 3.00E−11 | 2.90E−11 | 3.70E−11 |

As seen from Table 2, compared with the MIM capacitors (comparative examples 1 and 3) not including the upper barrier layer 33 (33$_1$ and 33$_2$), the MIM capacitors of the present embodiment including the upper barrier layer 33 (33$_1$ and 33$_2$) each exhibit a significantly lower (four decimal places or lower) leakage current.

In the MIM capacitors (comparative examples 2 and 4) using the monolayer barrier layer (SiN layer 33$_2$), while the individual leakage currents are somewhat reduced when the positive bias voltages are applied, the leakage currents are almost not reduced when the negative bias voltages are applied. This is because silicon atoms are injected into the tantalum oxide film 32 when the SiN layer 33$_2$ is formed by a sputtering process, and the tantalum oxide film 32 is thereby reduced.

The TCC and VCC2 values of the MIM capacitor of case where the sputter-$Ta_2O_5$ film is used. In comparison, the TCC and VCC2 values of the MIM capacitor of the present embodiment are 50 ppm or smaller in the case where the CVD-$Ta_2O_5$ film is used. Thus, compared to the characteristics of the MIM capacitors not employing the barrier layer, the TCC and VCC2 characteristics of the MIM capacitors employing the multilayer barrier layer are significantly improved.

The VCC1 value of the MIM capacitor of the present invention employing the multilayer barrier layer is 150 ppm in the case where the sputter-$Ta_2O_5$ film is used. In comparison, the VCC1 value of the MIM capacitor of the present invention is 50 ppm or smaller in the case where the CVD-$Ta_2O_5$ film is used.

Thus, the characteristic values (particularly, the VCC1 values) are different depending on the sputter-$Ta_2O_5$ film and the CVD-$Ta_2O_5$ film. One reason for the difference is considered to be the difference in the carbon impurity concentration of the $Ta_2O_5$ film.

a tantalum oxide has higher purity, the tantalum oxide more radically reacts with the TiN electrode.

A tantalum oxide film having higher impurity concentration lends itself to the flow of leakage current. As such, as shown in Table 2, under the condition where the bias voltage=±1.0 V, using the CVD-$Ta_2O_5$ film increases the leakage current to be about two times greater than using the sputter-$Ta_2O_5$ film.

While the present embodiment relates the example of the MIM capacitor including only a upper barrier layer, also an MIM capacitor including only a lower barrier layer can be implemented in a manner similar to the above. As a manufacturing method for such the structure only with one-side barrier layer, any one of other manufacturing method according to the embodiments described below may be employed.

(Second Embodiment)

FIGS. 4A to 4F are cross-sectional views showing manufacturing steps for a semiconductor device including an MIM capacitor according to a second embodiment of the present invention.

Differences of the MIM capacitor of the present embodiment from that of the first embodiment are that the MIM capacitor also includes a barrier layer between the lower electrode and the dielectric film, and the barrier layer is formed using a multilayer barrier layer formed of a SiON layer and a SiN layer.

Figure 4A:
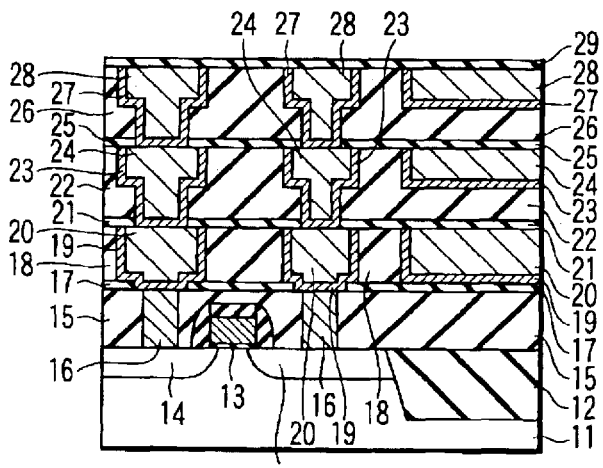
FIGS. 4A to 4F are cross-sectional views showing manufacturing steps for a semiconductor device including an MIM capacitor according to a second embodiment of the present invention.

As shown in FIG. 4A, a silicon substrate including MOS transistors, isolation region, and multilayer wiring layers is formed by well-known processes.

Figure 4B:
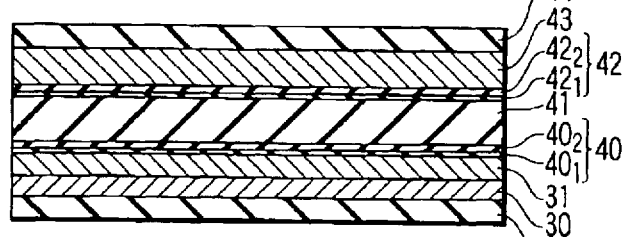

Subsequently, as shown in FIG. 4B, a titanium film 30 and a titanium nitride film 31 are sequentially formed by a sputtering process over a silicon nitride film 29. Up to this stage, processes are performed in the same manner as in the first embodiment.

Subsequently, as shown in FIG. 4B, a 3-nm-thick lower barrier layer 40 is formed according to a reactive sputtering process over the titanium nitride film 31 by using silicon nitride as a material.

For the present embodiment, three types of lower barrier layers 40 were formed. Specifically, the three types of layers formed are an un-doped silicon nitride layer, a silicon nitride layer doped with boron being used as a dopant, and a silicon nitride layer doped with indium being used as a dopant. The concentration of each of the boron and the indium in the individual silicon nitride layers were varied in a range of from 0.005 to 5%.

Deposition conditions for the lower barrier layers 40 are as described hereunder. The sputtering device is of an RF-superimposed DC type, the deposition temperature is a room temperature, the process gas is a mixed gas of Ar and $N_2$, $Ar/N_2$ is 0.93, and the sputtering power is 0.8 kW.

As a sputtering target, an un-doped silicon target was used for the un-doped silicon nitride layer. For the silicon nitride layer doped with boron or indium, an un-doped silicon target on which a silicon chip doped with boron or indium is overlaid was used.

Subsequently, as shown in FIG. 4B, a tantalum oxide film 41 is formed by a reactive sputtering process over the lower barrier layer 40.

Deposition conditions of the tantalum oxide film 41 are as described hereunder. The sputtering target is a tantalum metal target, the sputtering device is of a DC type, the deposition temperature is 330° C., the process gas is a mixed gas of Ar and $O_2$.

The $Ar/O_2$ flow ratio and the sputtering power were set to 0.6 and 2.0 kW, respectively, until the tantalum oxide film 41 was formed to a thickness of 5 nm. Thereafter, the $Ar/O_2$ flow ratio and the sputtering power were set to 1.3 and 1.0 kW, respectively, as in the first embodiment to deposit another 32 nm tantalum oxide film, and a 37-nm-thick tantalum oxide film 41 was thereby formed.

As in the present embodiment, the surface of the lower barrier layer 40 (SiN) is oxidized and is changed to SiON with initial deposition conditions being changed to contain more oxygen for the tantalum oxide film 41. Accordingly, the processing enables the lower barrier layer 40 including a multilayered structure formed of a SiON layer $40_2$ and a SiN layer $40_1$ to be obtained.

Meanwhile, in the present embodiment, the name "SiON layer (SiON)" refers to an insulating layer (insulator) composed of Si, O, and N as primary elements, and this names does not represent the composition ratio of a substance. (This applies also to other embodiment).

These processes completed a structure in which the tantalum oxide film 41 is formed over the lower barrier layer 40 including the multilayered structure formed of the SiON layer $40_2$ and the SiN layer $40_1$. After completion of the MIM capacitor, the thicknesses of the SiON layer $40_2$ and the SiN layer $40_1$ were evaluated using TEM (transmission electron microscopy) and were found to be approximately 1 nm and 2 nm, respectively.

Subsequently, as shown in FIG. 4B, an upper barrier layer 42 having a multilayered structure is formed by a reactive sputtering process over the tantalum oxide film 41. The upper barrier layer 42 includes a SiON layer $42_1$ and a SiN layer $42_2$ provided on the SiON layer $42_1$.

Deposition conditions of the upper barrier layer 42 are as described hereunder. The sputtering target is an un-doped silicon target, the deposition temperature is a room temperature, and the sputtering power is 0.8 kW. A mixed gas of Ar, $O_2$, and $N_2$ is used as a process gas for the SiON layer $42_1$, and the flow ratio ($Ar:O_2:N_2$) is 1:0.2:1. A process gas for the SiN layer $42_2$ is a mixed gas of Ar and $N_2$, and the flow ratio ($Ar/N_2$) is 0.93.

The composition of the SiON layer $42_1$ was evaluated with AES (Auger electron spectroscopy) and found to be $SiO_{0.5}N_{0.5}$. The deposition conditions were changed, a plurality of SiON layers $42_1$ with mutually different oxygen concentrations, and the SiON layers were compared and studied.

The result of the studies made it became clear that the composition of the SiON layer $42_1$ should correspond to an oxygen concentration of several percent to suppress the leakage current. The deposition conditions according to the present embodiment were found to be appropriate when forming the SiON layer $42_1$ having a uniform thickness and corresponding to the oxygen concentration over the entire surface of a wafer having a diameter of 200 mm.

The film thickness of each of the SiON layer $42_1$ and the SiN layer $42_2$ is 1.0 nm. That is, unlike in the first embodiment, in the present embodiment, a very thin dielectric film such as the SiO layer $33_1$ need not be used. The thickness of the SiON layer $42_1$ can thus be large for the reason that the permittivity of SiON is higher by several tens of percent than the permittivity of SiO (approximately 3.9) (a permittivity of SiON is approximately 5.2 in the present embodiment).

Subsequently, as shown in FIG. 4B, a titanium nitride film 43 used as the upper electrode is continually formed by a sputtering process over the upper barrier layer 42 in the sputtering device used to form the upper barrier layer 42. Thereafter, a silicon nitride film 44 is formed by a PECVD process over the titanium nitride film 43. The upper barrier layer 42 and the titanium nitride film 43 are thus continually formed in the same sputtering device.

Figure 4C:
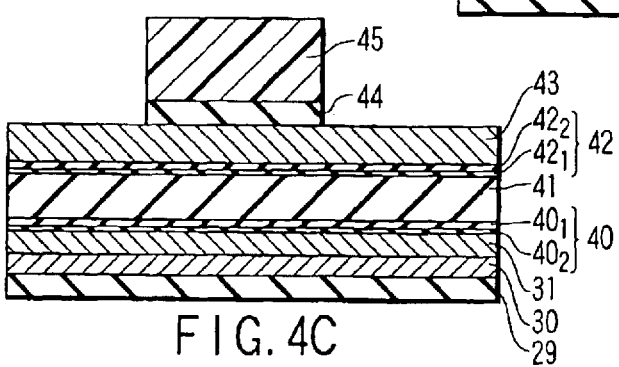

Subsequently, as shown in FIG. 4C, a resist pattern 45 is formed over the silicon nitride film 44. Then, with the resist pattern 45 being used as a mask, the silicon nitride film 44 is etched off. Thereby, a pattern of the resist pattern 45 is transferred onto the silicon nitride film 44. Thereafter, the resist pattern 45 is removed by ashing.

Figure 4D:
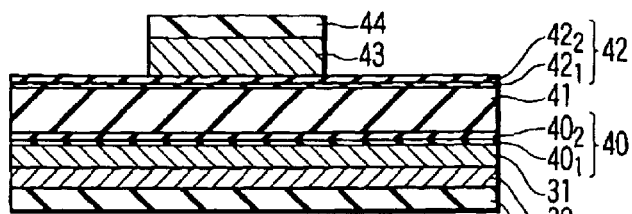

Subsequently, as shown in FIG. 4D, with the silicon nitride film 44 (hard mask) being used as a mask, the titanium nitride film 43 is etched off by an RIE process using a fluorine-based etching gas. Thereby, an upper electrode 43 (titanium nitride film) having a predetermined shape is obtained.

Figure 4E:
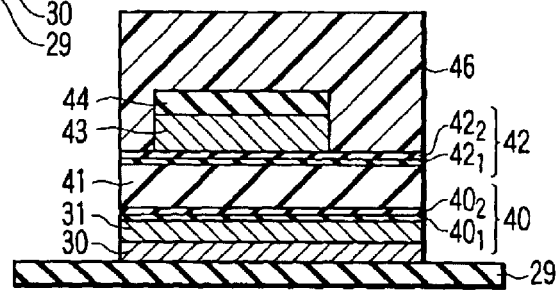

Subsequently, as shown in FIG. 4E, a resist pattern 46 is formed over the silicon nitride film 44 and the upper barrier layer 42. Thereafter, with the resist pattern 46 being used as a mask, the upper barrier layer 42, the tantalum oxide film 41, the lower barrier layer 40, titanium nitride film 31, and the titanium film 30 are sequentially etched off. Thereby, the upper barrier layer 42, the tantalum oxide film 41, the lower barrier layer 40, and the lower electrodes 30 and 31, individually having predetermined shapes, are obtained. Thereafter, the resist pattern 46 is removed by ashing.

Figure 4F:
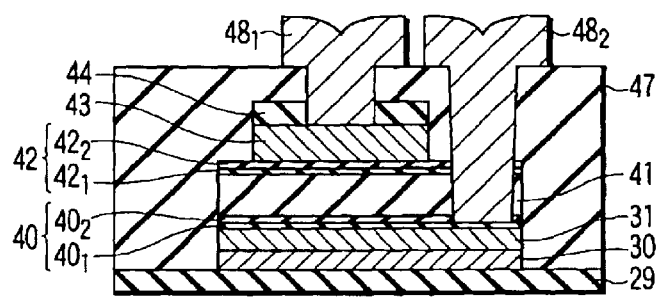

The steps described above complete a basic structure of the MIM capacitor. Thereafter, as shown in FIG. 4F, well-known steps follow. The steps to follow are, for example, a step of forming an interlayer dielectric film 47 over the entire surface of the substrate, a step of forming a lead-out electrode $48_1$ of the upper electrode 43 and a lead-out electrode $48_2$ of the lower electrode 31, and a step of forming a passivation film.

Figure 5:
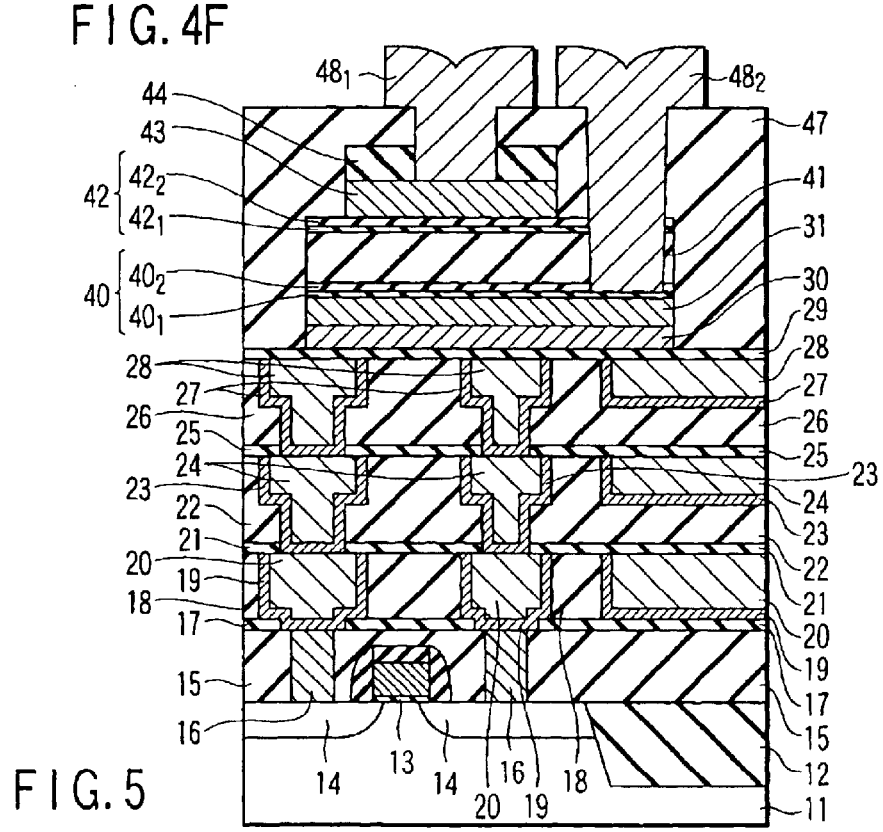
FIG. 5 is a cross-sectional view showing a semiconductor device including the MIM capacitor according to the second embodiment of the present invention.
Figure 6A:
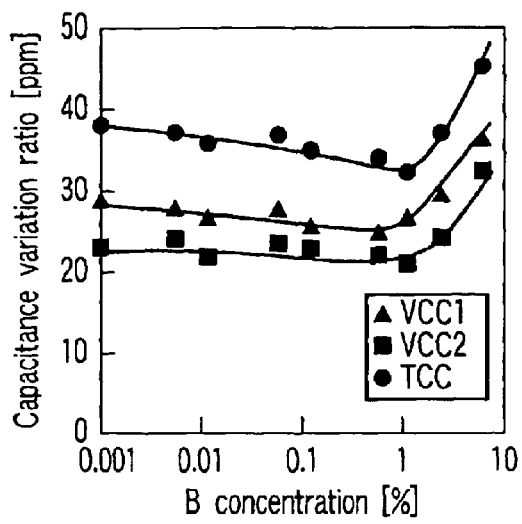
FIGS. 6A to 6D are characteristic diagrams showing capacitance variation ratios and leakage currents dependencies on dopant concentration in upper barrier layers of the MIM capacitors according to the second embodiment.
Figure 6C:
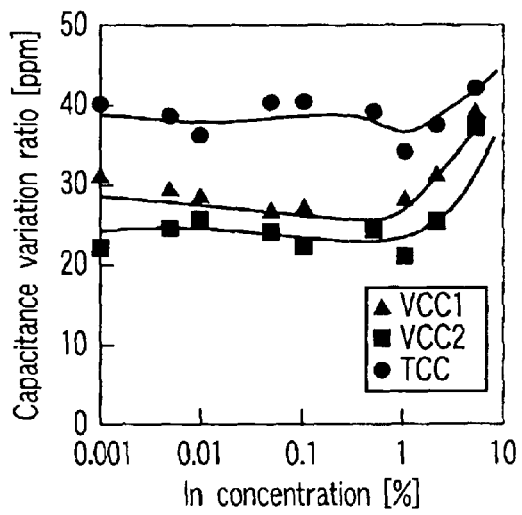
Figure 6B:
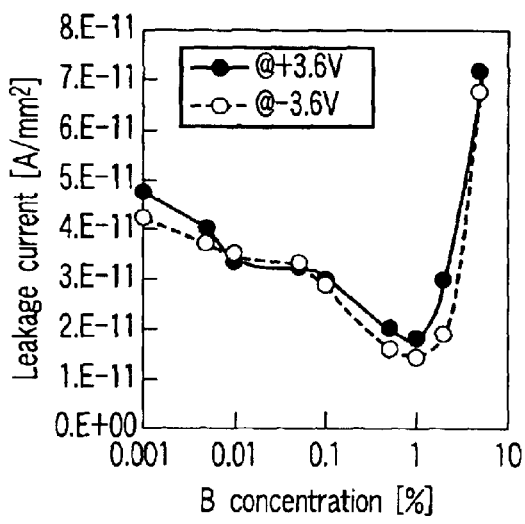
Figure 6D:
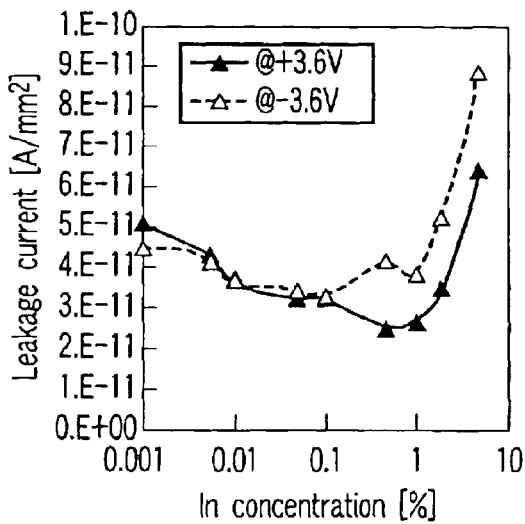

For the interlayer dielectric film 47, generally, a dielectric film having a low permittivity, which is a so-called "low-k film," is used. A semiconductor device of the present embodiment, which has been obtained through the steps described above, is shown in FIG. 5 in the form of a cross-sectional view.

The lead-out electrodes $48_1$ and $48_2$ are formed by processes described hereunder in detail. First, the interlayer dielectric film 47, the silicon nitride film 44, the tantalum oxide film 41, and the lower barrier layer 40 are etched using a photolithography process and an RIE process. Thereby, first and second contact holes individually communicating with the upper electrode 43, and the titanium nitride film 31 and the multilayer wiring layer are formed. The RIE processing uses a fluorine-based etching gas.

Subsequently, an aluminum film is formed by a sputtering process over the entire surface of the substrate so as to fill the insides of the first and second contact holes. The aluminum film is then processed by a photolithography processing and an RIE process. Thus, the lead-out electrodes $48_1$ and $48_2$ formed of the aluminum film can be obtained.

Similar to the case in the first embodiment, the MIM capacitor with a low leakage current and a high capacitance density can easily be realized in the present embodiment (the capacitance density of the MIM capacitor of the present embodiment was 4.0 fF/$\mu m^2$). Thereby, the size of an RF-embedded LSI chip expected to be mounted in any devices in the future can be reduced. Consequently, miniaturization of the devices can be implemented.

Investigations were carried out on a series of MIM capacitors manufactured this time according to the present embodiment. It was measured that capacitance variation ratio (VCC1, VCC2, and TCC) and leakage current dependencies on dopant concentration in the upper barrier layers 42. FIGS. 6A to 6D show the investigation results. The leakage currents are investigated when a bias voltage (±3.6 V) is applied at 100° C. In each of FIGS. 6A to 6D, the horizontal axis represents a logarithmic-representation graph with the dopant concentration (the boron concentration or indium concentration). In the representation, the leftmost point represents the 0% dopant concentration, i.e., a case where the upper barrier layer 42 is not doped with the dopant.

As can be seen from FIGS. 6A to 6D, unlike the case of the first embodiment, in the present embodiment of the MIM capacitor, also the leakage current at the time of the positive bias application is reduced regardless of the dopant concentration. This is attributed to the fact that in the present embodiment, the barrier layers are individually provided between the lower electrode and the dielectric film and between the upper electrode and the dielectric film.

In addition, as can be seen from FIGS. 6A to 6D, a leakage-current reduction effect can be expected at a dopant concentration of 0.01% or higher. In addition, it can be seen from the figures that with the dopant concentration increased to be 0.1% or higher, the leakage current is reduced to be about half a decimal place smaller than in the case where the dopant concentration is 0% (in the case of the un-doped upper barrier layer 42). As such, preferably, the lower limit of the dopant concentration is set to 0.01% or higher, and more preferably 0.01% or higher.

The present inventor carried out evaluation at 85° C. regarding TDDBs (time dependent dielectric breakdowns) of MIM capacitors (boron concentration=0.01%) producing a leakage-current reduction effect and MIM capacitors (boron concentration=0.005%) not producing a leakage-current reduction effect. The results are shown in Table 3.

TABLE 3

|  | Un-Doping | B Concentration = 0.005% | B Concentration = 0.1% |
|---|---|---|---|
| Service Life (Years) | 12.2 years | 12.3 years | 23.1 years |

As can be seen from Table 3, while any one of the MIM capacitors already achieves a life time of 10 or more years that is required to be guaranteed for an ordinary device, an even longer service life (high reliability) can be realized by doping the upper barrier layer 42 with the dopant.

The above is attributable to the fact that when the lower barrier layers 40 and 42 are doped with the dopant acting as an acceptor with respect to silicon, the effect of an oxygen deficiency or vacancy (donor) that can relatively easily formed in the tantalum oxide film 41 during a heat treatment or the like can be reduced.

According to FIGS. 6A to 6D, in the MIM capacitor in which the dopant concentration exceeds a certain high concentration (4%), the characteristics are adversely affected. This is considered to be attributed to the fact that the insulating property of the SiN layer or the SiON layer in the lower barrier layers 40, 42 is deteriorated. Further, it can be known that the leakage current abruptly increases when a dopant concentration of 1% is exceeded. From these factors, preferably, the upper limit is set to 4% or lower, and more preferably, 1% or lower.

Furthermore, from the FIGS. 6A to 6D and Table 2, it can be known that TCC, VCC1, and VCC2 of the MIM capacitor according to the present embodiment are improved better than those of the MIM capacitor of the first embodiment, regardless of the dopant concentration; and particularly, the improvement in VCC1 is noticeable. This is attributed to the fact that, in the present embodiment, the lower barrier layer 40 works to suppress the reaction between the lower electrode (titanium nitride film) 31 and the tantalum oxide film 32, which occurs to greater or lesser degrees in the first embodiment depending on the deposition technique (sputtering or CVD process) for the tantalum oxide film 32.

(Third Embodiment)

A third embodiment of the present invention will be described hereinbelow. Differences of an MIM capacitor of the present embodiment from that of the second embodiment are that a multilayer barrier layer formed of a SiO layer and a SiN layer is used as the lower barrier layer, and a monolayer barrier layer formed of a SiON layer is used as the upper barrier layer.

In addition, a silicon nitride film formed by a sputtering process is used. The silicon nitride film is used as an etching mask for a conductive film as a upper electrode. As a sputtering target for the silicon nitride film, a silicon target doped with 0.1% boron is used. Using this sputtering target, autodoping is implemented. The autodoping avoids having to perform RF-superimposition for the sputtering target, therefore enabling the silicon nitride film to be formed using a simplified sputtering device.

Hereinbelow, a manufacturing method for the semiconductor device including the MIM capacitor according to the present embodiment will be described with reference to FIGS. 7A to 7D.

Figure 7A:
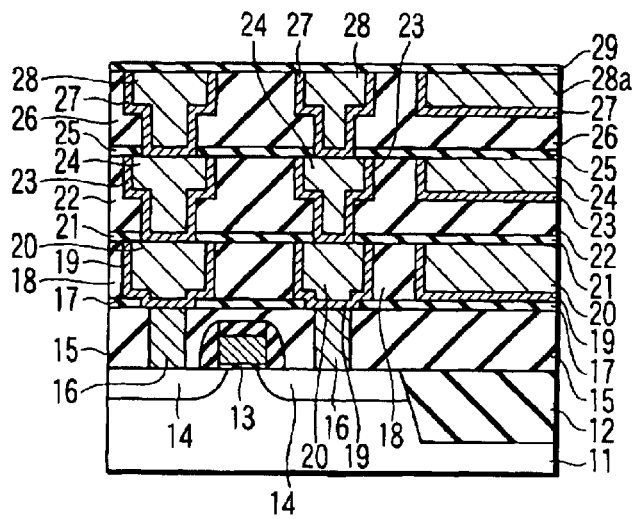
FIGS. 7A to 7F are cross-sectional views showing manufacturing steps for a semiconductor device including an MIM capacitor according to a third embodiment of the present invention.

Firstly, as shown in FIG. 7A, a silicon substrate including MOS transistors, isolation region, and multilayer wiring layers is formed by well-known processes.

Figure 7B:
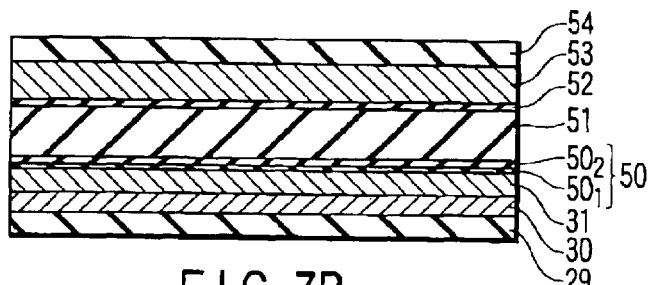

Subsequently, as shown in FIG. 7B, a titanium film 30 and a titanium nitride film 31 are sequentially formed by a sputtering process over a silicon nitride film 29. Up to this stage, processes are performed in the same manner as in the second embodiment.

Subsequently, as shown in FIG. 7B, a 2.4 nm thick lower barrier layer 50 having a multilayered structure is formed according to a reactive sputtering process over the titanium nitride film 31.

The lower barrier layer 50 includes a 2 nm thick SiN layer $50_1$ and a 0.4 nm thick SiO layer $50_2$ provided on the thick SiN layer $50_1$.

Deposition conditions for the lower barrier layer 50 are as described hereunder. The sputtering target is the silicon target doped with 1% boron (as described above), the deposition temperature is 300° C., and the sputtering power is 0.8 kW. The process gas for the thick SiN layer $50_1$ is a mixed gas of Ar and $N_2$, and the flow ratio (Ar/$N_2$) thereof is 1.20. The process gas for the SiO layer $50_2$ is a mixed gas of Ar and $O_2$, and the flow ratio (Ar/$O_2$) thereof is 1.4.

Subsequently, as shown in FIG. 7B, a 37-nm-thick tantalum oxide film 51 is formed by a reactive sputtering process over the lower barrier layer 50.

Deposition conditions of the tantalum oxide film 51 are as described hereunder. A sputtering target is a tantalum metal target, the sputtering device is of a DC type, the deposition temperature is 200° C., the process gas is a mixed gas of Ar and $O_2$, the Ar/$O_2$ flow ratio is 1.3, and the sputtering power is 1.0 kW.

Subsequently, as shown in FIG. 7B, an upper barrier layer 52 is formed using SiON as a material according to a reactive sputtering process over the tantalum oxide film 51.

Deposition conditions of the upper barrier layer 52 are as described hereunder. The sputtering target is an un-doped silicon target; the deposition temperature is 300° C.; a mixed gas of Ar, $O_2$ and $N_2$ is used as the process gas; the flow ratio (Ar:$O_2$:$N_2$) is 1:0.1:1.5; and the sputtering power is 0.8 kW.

The composition of the upper barrier layer 52 was evaluated with an AES and found to be $SiO_{0.2}N_{0.8}$. The permittivity of the upper barrier layer 52 was approximately 6.

The upper barrier layer 52 directly contacts the tantalum oxide film 51. Hence, an undesirable case can occur in which the tantalum oxide film 51 is deteriorated. To prevent such deterioration of the tantalum oxide film 51, the oxygen ratio of the upper barrier layer (SiON layer) 52 needs to be reduced. As such, in the present embodiment, the upper barrier layer 52 is formed by thermal sputtering at 300° C.

The upper barrier layer 52 has a thickness of 2.1 nm. As in the present embodiment, in a case where the SiON layer is used to form the upper barrier layer 52, there is an advantage in that the SiON layer can be formed into a simple structure. More specifically, the SiON layer can be formed into a relatively thick monolayer structure.

Subsequently, as shown in FIG. 7B, a titanium nitride film 53 used as the upper electrode is formed by a sputtering process over the upper barrier layer 52 in the sputtering device used to form the upper barrier layer 52. Thereafter, a silicon nitride film 54 is formed over the titanium nitride film 53 under the same sputtering conditions as used for the SiN layer $50_1$. The upper barrier layer 52 and the titanium nitride film 53 are thus continually formed in the same sputtering device.

Suppose the silicon nitride film is formed by a PECVD process over the MIM capacitor, as in the prior art. In this case, the lower electrode, the dielectric film, and the upper electrode are continually formed over the substrate. Thereafter, the substrate is unloaded from the inside of a PECVD device (vacuum chamber), once the substrate is again loaded into the PECVD device, and the silicon nitride film is thereby deposited. This method is therefore problematic in that a longer processing time is required.

In comparison, in the present embodiment, the titanium nitride film 53 and the silicon nitride film 54 are formed in the same sputtering device used to form the upper barrier layer 52. As such, since steps from the deposition of the upper barrier layer 52 to the deposition of the silicon nitride film 54 can be continually implemented, the processing time can be reduced.

Figure 7C:
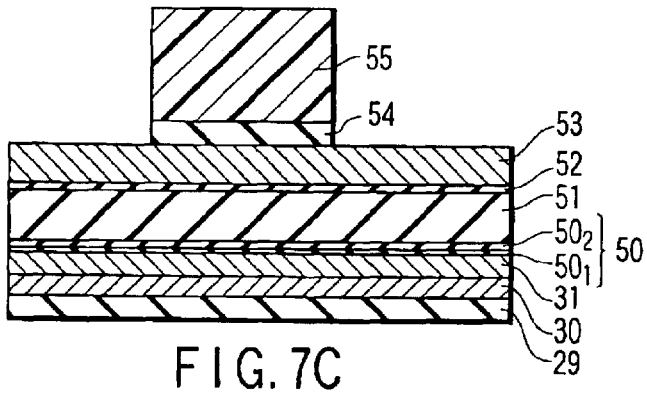

Subsequently, as shown in FIG. 7C, a resist pattern 55 is formed over the silicon nitride film 54. Then, with the resist pattern 55 being used as a mask, the silicon nitride film 54 is etched off. Thereby, a pattern of the resist pattern 55 is transferred onto the silicon nitride film 54. Thereafter, the resist pattern 55 is removed by ashing.

Figure 7D:
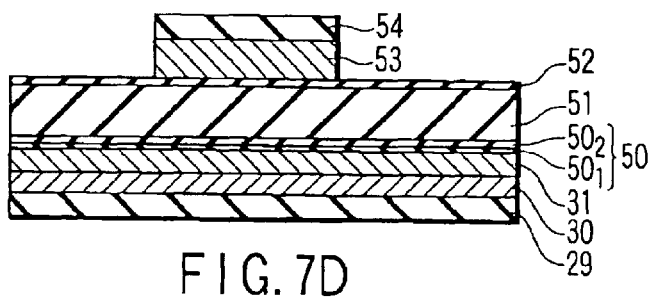

Subsequently, as shown in FIG. 7D, with the silicon nitride film 54 (hard mask) being used as a mask, the titanium nitride film 53 is etched off by an RIE process using a fluorine-based etching gas. Thereby, an upper electrode (titanium nitride film) 53 having a predetermined shape is obtained.

Figure 7E:
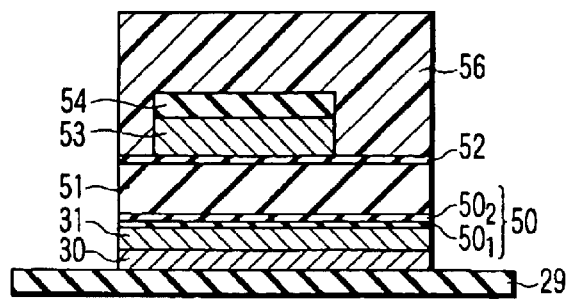

Subsequently, as shown in FIG. 7E, a resist pattern 56 is formed over the silicon nitride film 54 and the upper barrier layer 52. Thereafter, with the resist pattern 56 being used as a mask, the upper barrier layer 52, the tantalum oxide film 51, the lower barrier layer 50, titanium nitride film 31, and the titanium film 30 are sequentially etched off. Thereby, the upper barrier layer 52, the tantalum oxide film 51, the lower barrier layer 50, and the lower electrodes 30 and 31, individually having predetermined shapes, are obtained. Thereafter, the resist pattern 56 is removed by ashing.

Figure 7F:
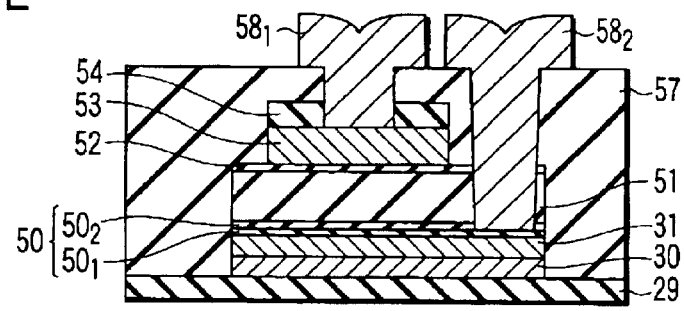

The steps described above complete a basic structure of the MIM capacitor. Thereafter, as shown in FIG. 7F, well-known steps follow. The steps to follow are, for example, a step of forming an interlayer dielectric film 57 over the entire surface of the substrate, a step of forming a lead-out electrode $58_1$ of the upper electrode 53 and a lead-out electrode $58_2$ of the lower electrode 31, and a step of forming a passivation film.

Figure 8:
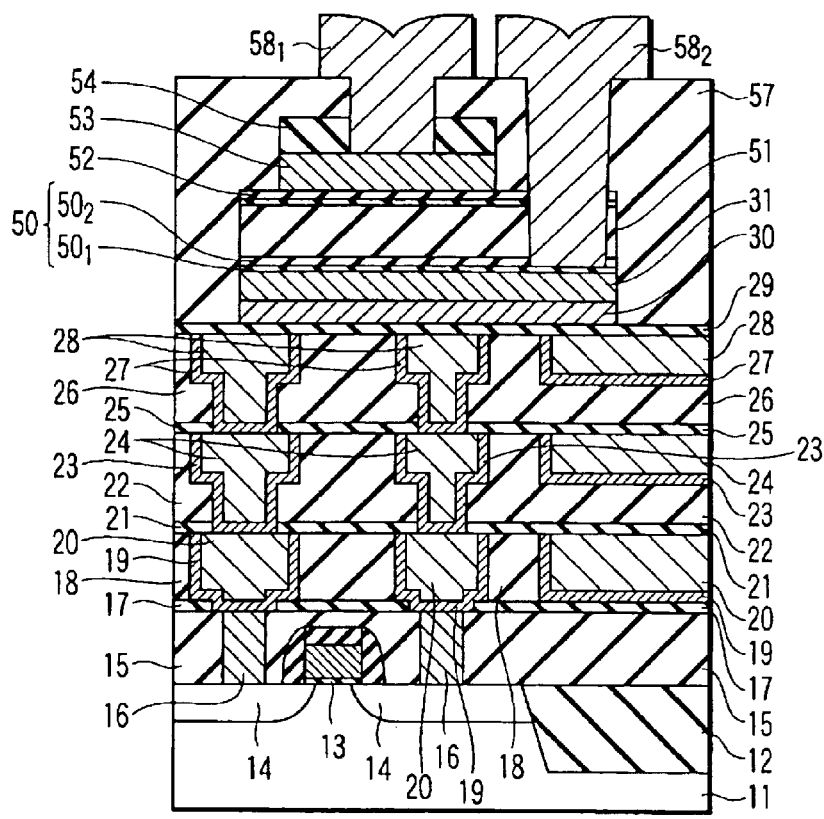
FIG. 8 is a cross-sectional view showing a semiconductor device including the MIM capacitor according to the third embodiment of the present invention.

For the interlayer dielectric film 57, generally, a dielectric film having a low permittivity, which is so-called a "low-k film," is used. A semiconductor device of the present embodiment, which has been obtained through the steps described above, is shown in FIG. 8 in the form of a cross-sectional view.

The lead-out electrodes $58_1$ and $58_2$ are formed by processes described hereunder in detail. First, the interlayer dielectric film 57, the silicon nitride film 54, the titanium nitride film 53, the upper barrier layer 52, the tantalum oxide film 51, and the lower barrier layer 50 are sequentially etched off using a photolithography process and an RIE process. Thereby, first and second contact holes individually communicating with the upper electrode 53 and the lower electrode 31 are formed. The RIE processing uses a fluorine-based etching gas.

Subsequently, an aluminum film is formed by a sputtering process over the entire surface of the substrate so as to fill the insides of the first and second contact holes. The aluminum film is then processed by a photolithography processing and an RIE process. Thus, the lead-out electrodes $58_1$ and $58_2$ formed of the aluminum film can be obtained.

Similar to the case of the first embodiment, the MIM capacitor with a low leakage current and a high capacitance density can easily be realized in the present embodiment (the capacitance density of the MIM capacitor of the present embodiment was 4.0 fF/$\mu m^2$). Thereby, the size of an RF-embedded LSI chip expected to be mounted in any devices in the future can be reduced. Consequently, miniaturization of the devices can be implemented.

As comparative example (for a reference), the present inventor prepared a same MIM capacitor as that of the present embodiment, except that the silicon nitride film 54 was formed by a PECVD process as in the first and second embodiments.

Table 4 shows VCC1, VCC2, and TCC values and leakage-current values of the MIM capacitor using the silicon nitride film 54 (sputter SiN) of the present embodiment and the MIM capacitor using a silicon nitride film (PECVD-SiN) of the comparative example. The bias voltages (±1.0 V and ±3.6 V) are applied at 100° C. in the leakage current measurement.

TABLE 4

|  | TCC [ppm] | VCC1 [ppm] | VCC2 [ppm] | Leakage Current (A/mm$_2$ Measurement Values at 100° C.) | | | |
|---|---|---|---|---|---|---|---|
|  |  |  |  | +3.6 V | +1.0 V | −1.0 V | −3.6 V |
| Sputter-SiN | 36 | 28 | 21 | 9.00E−12 | 3.60E−12 | 2.60E−12 | 8.90E−12 |
| PECVD-SiN | 38 | 27 | 22 | 2.10E−11 | 8.00E−12 | 7.50E−12 | 1.60E−11 |

As can be seen from Table 4, according to the present embodiment, the TCC, VCC1, and VCC2 values not exceeding 50 ppm were attained, similar to the case of the second embodiment.

The following can be known from comparison between the comparative example (PECVD-SiN) and the present embodiment (sputter SiN) in terms of the leakage currents when the low bias voltage (±1.0 V) was applied. That is, while the leakage current of the comparative example is same as that in the first embodiment, the leakage current in the present embodiment is reduced to be smaller than that in the first embodiment.

These results can be explained as follows. Since the PECVD-SiN contains hydrogen, the tantalum oxide film 51 is reduced by hydrogen radicals during its deposition and a subsequent heating process (such as a process of forming the interlayer dielectric film 57). On the other hand, however, since the sputter SiN does not contain hydrogen, the tantalum oxide film 51 is not reduced during the deposition and the subsequent heating process. The prevention of the reduction in the tantalum oxide film 51 is considered to have caused the leakage current to decrease with the sputter SiN being used.

(Fourth Embodiment)

FIGS. 9A to 9D are cross-sectional views individually showing manufacturing steps for a semiconductor device including an MIM capacitor according to a fourth embodiment of the present invention.

The MIM capacitor of the present embodiment is significantly different from those of the first to third embodiments described above in that a Cu-DD wiring formed as a top layer of a multilayer wiring layer is used as the lower electrode. The Q value of the circuit can easily be increased, and concurrently, the number of lithography steps can be reduced by use of copper having a lower resistance than that of titanium nitride and tantalum nitride.

Figure 9A:
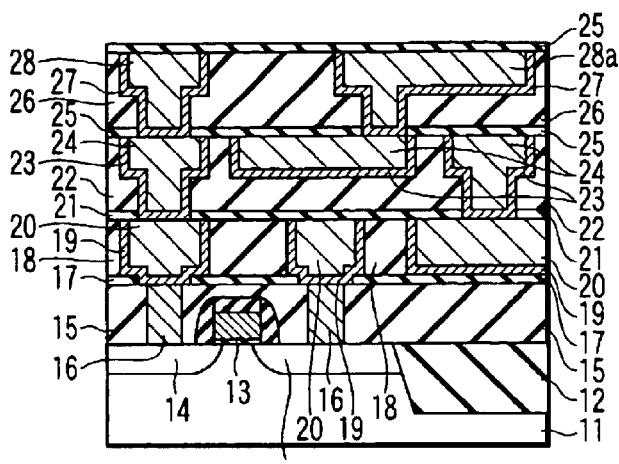
FIGS. 9A to 9D are cross-sectional views showing manufacturing steps for a semiconductor device including an MIM capacitor according to a fourth embodiment of the present invention.

Firstly, as shown in FIG. 9A, a silicon substrate including MOS transistors, isolation region, and multilayer wiring layers is formed by well-known processes. Up to this stage, processes are performed in the same manner as in the first embodiment. However, copper is used as the material of the DD wiring at least the top layer in the multilayer wiring layer. In the present embodiment, a portion of the DD wirings 28, that is, the top layer of the multilayer wiring layer, concurrently serves as the lower electrode of the MIM capacitor. In the drawing, the portion of the DD wiring, which concurrently serves as the lower electrode, is shown with reference numeral 28a.

Figure 9C:
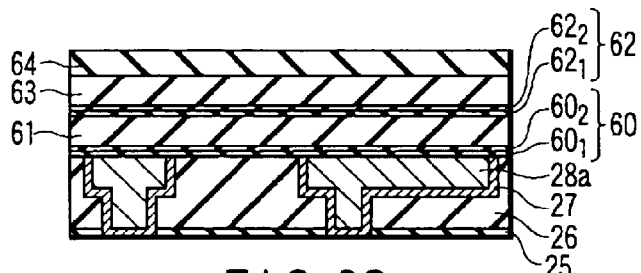
Figure 9B:
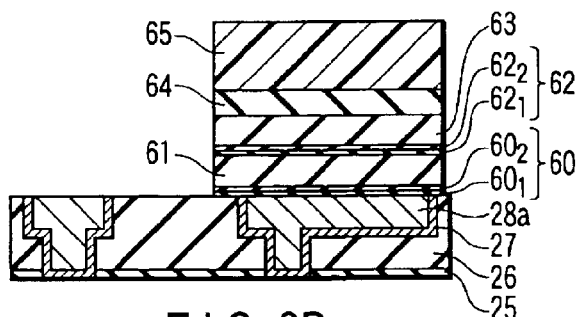
Figure 9D:
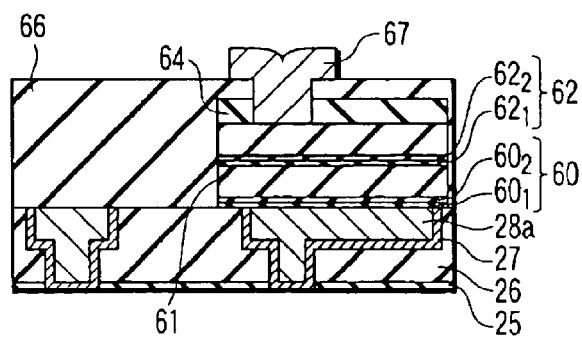

Subsequently, as shown in FIG. 9B, over the multilayer wiring layer, there are sequentially formed a lower barrier layer 60 including a multilayered structure formed of a SiON layer 60$_2$ (thickness: 1 nm) and a SiN layer 60$_1$ (thickness: 2 nm), a tantalum oxide film 61 (thickness: 37 nm), an upper barrier layer 62 including a multilayered structure formed of a SiN layer 62$_2$ (thickness: 2 nm) and a SiON barrier layer 62$_1$ (thickness: 1 nm).

Methods for forming the lower barrier layer 60, the tantalum oxide film 61, and an upper barrier layer 62 are same as those for the lower barrier layer 40, the tantalum oxide film 41, and the upper barrier layer 42, respectively, in the second embodiment. However, for a sputtering target and a sputtering device, those as used in the third embodiment are used. That is, a silicon target doped with a dopant such as boron and a DC-type sputtering device are used in the present embodiment.

Subsequently, as shown in FIG. 9B, a titanium nitride film 63 used as the upper electrode and a silicon nitride film 64 used as a mask are sequentially deposited over the upper barrier layer 62 by using a sputtering process in the same DC-type sputtering device used for the prior steps. The upper barrier layer 62, the titanium nitride film 63, and the silicon nitride film 64 are thus continually formed in the same sputtering device.

Subsequently, as shown in FIG. 9C, a resist pattern 65 is formed over the silicon nitride film 64. Then, with the resist pattern 65 being used as a mask, the silicon nitride film 64 is etched off. Thereby, a pattern of the resist pattern 65 is transferred onto the silicon nitride film 64.

For the resist pattern 65 described above, a resist pattern that causes the silicon nitride film 64 to be larger than the DD wiring 28a is used. That is, the MIM capacitor including the upper electrode larger than the lower electrode is formed in the present embodiment.

Subsequently, as shown in FIG. 9C, the titanium nitride film 63, the upper barrier layer 62, the tantalum oxide film 61, and the lower barrier layer 60 are etched off individually using the resist pattern 65 and the silicon nitride film 64 as masks. Thereby, the upper electrode 63, the upper barrier layer 62, the tantalum oxide film 61, and the lower barrier layer 60 that individually having predetermined shapes are obtained.

In this case, the resist pattern 65 is etched off simultaneously during the etching. As such, the etching proceeds with the silicon nitride film 64 being used as the mask. Alternatively, the etching may be performed by using the silicon nitride film 64 as the mask after the resist pattern 65 has been removed by ashing.

The steps described above complete a basic structure of the MIM capacitor. Thereafter, as shown in FIG. 9E, well-known steps follow. The steps to follow are, for example, a step of forming an interlayer dielectric film 66 over the entire surface of the substrate, a step of forming a lead-out electrode 67 of the upper electrode 63, and a step of forming a passivation film.

Figure 10:
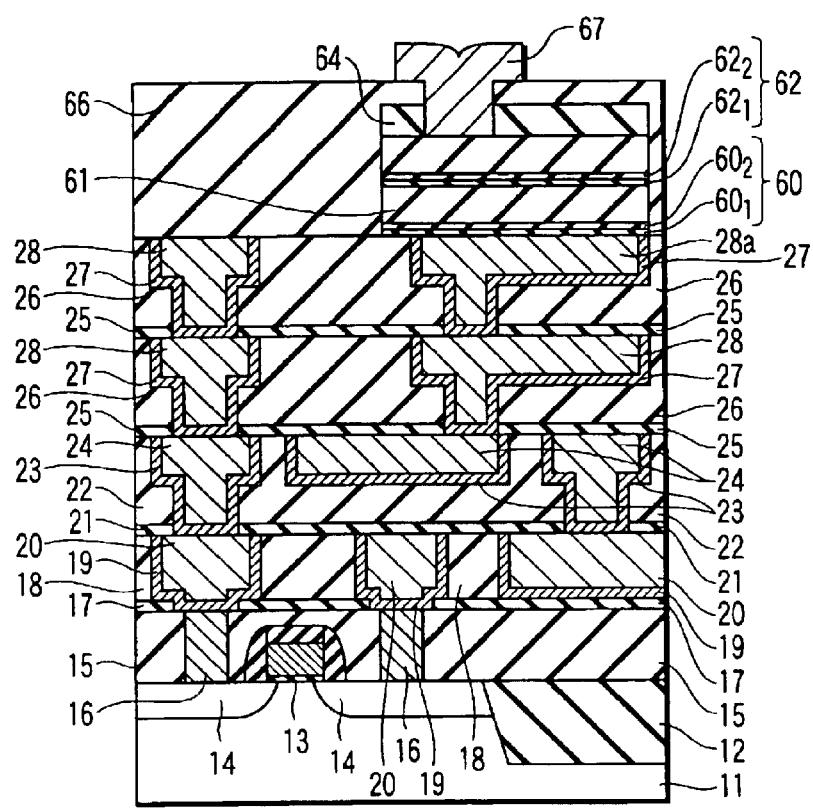
FIG. 10 is a cross-sectional view showing a semiconductor device including the MIM capacitor according to the fourth embodiment of the present invention.

For the interlayer dielectric film 66, generally, a dielectric film having a low permittivity, which is so-called a "low-k film," is used. A semiconductor device of the present embodiment, which has been obtained through the steps described above, is shown in FIG. 10 in the form of a cross-sectional view.

In each of the first to third embodiments, the contact holes need to be formed so as to communicate with the lower electrode. As such, etching is indispensably performed for the dielectric film (tantalum oxide film). However, etching of this type is not easy.

In comparison, in the present embodiment, since the DD wirings 28 are concurrently used as the lower electrode, contact holes communicating with the lower electrode need not be formed. Consequently, the dielectric film (tantalum oxide film) need not be etched.

Contact holes communicating with the upper electrode 63, the titanium nitride film are formed by etching the silicon nitride film 64 and the interlayer dielectric film 66. The silicon nitride film 64 and the interlayer dielectric film 66 can easily be etched off. The present embodiment thus offers the advantage of facilitating the etching process in the step of forming the lead-out electrode.

In addition, the present embodiment obviates the necessities for performing etching steps that use resist patterns corresponding to the resist pattern 36 according to the first embodiment, the resist pattern 45 according to the second embodiment, and the resist pattern 55 according to the third embodiment. Hence, according the present embodiment, the number of lithography processes and etching processes required for forming the MIM capacitor is three times each which is fewer by one each compared to each of the first to third embodiments.

Similar to the case of the first embodiment, the MIM capacitor with a low leakage current and a high capacitance density can easily be realized in the present embodiment (the capacitance density of the MIM capacitor of the present embodiment was 4.0 fF/$\mu$m$^2$). Thereby, the size of an RF-embedded LSI chip expected to be mounted in any devices in the future can be reduced. Consequently, miniaturization of the devices can be implemented.

As in the second embodiment, also the MIM capacitor of the present embodiment attained high TCC, VCC1, VCC2, and leakage-current values. In addition, the Q value of a circuit using the MIM capacitor according to the present embodiment was proven to be approximately two times higher than the Q value of a circuit using the MIM capacitor of the second embodiment. The high Q value can be obtained by using MIM capacitors according to the present embodiment for the reason that the low-resistance (DD wiring) 28a is used for the lower electrode in the present embodiment.

The present invention is not limited by the embodiments. For example, the multilayer film formed of the titanium film and the titanium nitride film is used as the lower electrode in the embodiments. Alternatively, however, the present invention allows use of a metal-including monolayer conductive film such as a titanium film, a tungsten nitride film, or a tantalum nitride film, or a metal-including multilayer conductive film such as a titanium nitride film, an AlCu film, and a titanium nitride film and the like.

The titanium nitride film is used as the upper electrode in the embodiments. However, conductive films similar to those used as the above-described lower electrode may be used as the upper electrode.

The tantalum oxide film is used as the dielectric film in the embodiments; alternatively, however, a niobium oxide film may be used.

Figure 11A:
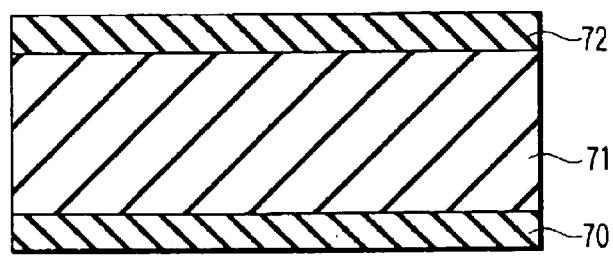
FIGS. 11A and 11B are cross-sectional views showing barrier layers of MIM capacitors according to other embodiments of the present invention.
Figure 11B:
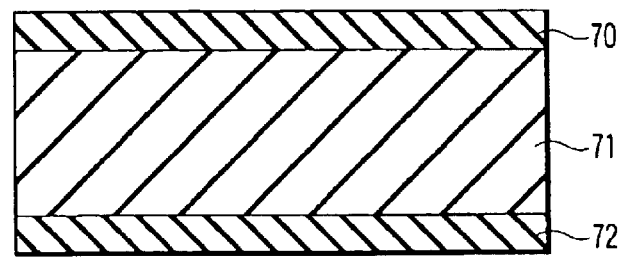

The embodiments use either a double-layered barrier layer formed of the SiN layer and the SiO layer or a double-layered barrier layer formed of the SiN layer and the SiON layer as the barrier layer. However, as shown in FIGS. 11A to 11B, the present invention allows use of a triple-layered barrier layer formed of a SiN layer 70, a SiON layer 71, and a SiO layer 72. FIG. 11A depicts a lower-layer side (lower-electrode side) barrier layer, and FIG. 11B depicts an upper-layer side (upper-electrode side) barrier layer. Alternatively, a multilayer barrier formed of four or more layers may be used.

The upper barrier layer and the lower barrier layer may each be a triple-layered barrier layer; or alternatively, only one of the upper barrier layer or the lower barrier layer may be a triple-layered barrier layer. In the latter case, the upper barrier layer or the lower barrier layer may use any one of the barrier-layer structures described above.

Even with these multilayer barrier layers being used, effects similar to those of the embodiments can be obtained, and further, additional effects described hereunder can be obtained. The composition (Si, N, and O) in the thickness direction of a barrier layer varies gradually. This enables effects in which the barrier layer (such as the SiN layer 70 or the SiO layer 72) is stabilized with respect to a heat treatment to be obtained.

The lower barrier layer according to the individual embodiments is the insulating layer that contains silicon, oxygen, and nitrogen and that contains the nitrogen at least in a portion on the side contacting the lower electrode and the oxygen at least in a portion on the side contacting the dielectric film. However, the lower barrier layer may be an insulating layer that contains silicon and oxygen (not containing nitrogen) and that contains the oxygen at least in a portion on the side contacting the dielectric film. Alternatively, the lower barrier layer may be an insulating layer that contains silicon and nitrogen (not containing oxygen) and that contains the nitrogen at least in a portion on the side contacting the lower electrode. These insulating layers may each be of either a monolayer structure or a multilayered structure.

The upper barrier layer according to the individual embodiments is the insulating layer that contains silicon, oxygen, and nitrogen and that contains the nitrogen at least in a portion on the side contacting the upper electrode and the oxygen at least in a portion on the side contacting the dielectric film. However, the upper barrier layer may be an insulating layer that contains silicon and oxygen (not containing nitrogen) and that contains the oxygen at least in a portion on the side contacting the dielectric film. Still alternatively, the upper barrier layer may be an insulating layer that contains silicon and nitrogen (not containing oxygen) and that contains the nitrogen at least in a portion on the side contacting the upper electrode. These insulating layers also may each be of either a monolayer structure or a multilayered structure.

Furthermore, while the silicon substrate is used in the individual embodiments, any one of a SOI substrate, a SiGe substrate, and a strained silicon substrate may be used instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a capacitor provided above the semiconductor substrate, the capacitor comprising:
   a lower electrode containing metal;
   a dielectric film containing tantalum oxide or niobium oxide;
   an upper electrode containing metal; and
   at least one of a lower barrier layer which is provided between the lower electrode and the dielectric film and an upper barrier layer which is provided between the upper electrode and the dielectric film,
   the lower barrier layer being insulating layers which contain silicon, oxygen and nitrogen, containing the nitrogen at least in a portion on a side contacting the lower electrode and containing the oxygen in an portion on a side contacting the dielectric film,
   the upper barrier layer being insulating layer which contains silicon, oxygen and nitrogen, containing the nitrogen at least in a portion on a side contacting the upper electrode and containing the oxygen in a portion on a side contacting the dielectric film.

2. The semiconductor device according to claim 1, wherein the lower barrier layer and the upper barrier layer are each a monolayer and contain silicon, nitrogen and oxygen.

3. The semiconductor device according to claim 1, wherein the lower barrier layer and the upper barrier layer are each a multilayer including an insulting layer containing silicon and nitrogen, an insulating layer containing silicon and oxygen, and an insulting layer provided between the insulating layers and containing silicon, nitrogen, and oxygen, nitrogen and oxygen.

4. The semiconductor device according to claim 1, wherein the metal is titanium or tantalum.

5. A semiconductor device comprising:
   a semiconductor substrate; and
   a capacitor provided above the semiconductor substrate, the capacitor comprising:
   a lower electrode containing metal;
   a dielectric film containing tantalum oxide or niobium oxide;
   an upper electrode containing metal; and
   at least one of a lower barrier which is provided between the lower electrode and the dielectric film and an upper barrier layer which is provided between the upper electrode and the dielectric film,
   the lower barrier layer and the upper barrier layer being insulating layers which contains silicon and oxygen, and containing the oxygen at least in a portion on a side contacting the dielectric film,
   wherein the lower barrier layer and the upper barrier layer are each a monolayer and contain silicon, nitrogen, and oxygen.

6. A semiconductor device comprising:
   a semiconductor substrate; and
   a capacitor provided above the semiconductor substrate, the capacitor comprising:
   a lower electrode containing metal;
   a dielectric film containing tantalum oxide or niobium oxide;
   an upper electrode containing metal; and
   at least one of a lower barrier layer which is provided between the lower electrode and the dielectric film and an upper barrier layer which is provided between the upper electrode and the dielectric film,
   the lower barrier layer being insulating layer which contains silicon and nitrogen, containing the nitrogen at least in a portion on a side contacting the lower electrode,
   the upper barrier layer being an insulating layer which contains silicon and nitrogen, and containing the nitrogen at least in a portion on a side contacting the upper electrode,
   wherein the lower barrier layer and the upper barrier layer are each a monolayer and contain silicon, nitrogen, and oxygen.

7. A semiconductor device comprising:
   a semiconductor substrate; and
   a capacitor provided above the semiconductor substrate, the capacitor comprising:
   a lower electrode containing metal;
   a dielectric film containing tantalum oxide or niobium oxide;
   an upper electrode containing metal; and
   at least one of a lower barrier layer which is provided between the lower electrode and the dielectric film and an upper barrier layer which is provided between the upper electrode and the dielectric film,
   the lower barrier layer and the upper barrier layer being insulating layers which contain silicon and oxygen, and containing the oxygen at least in a portion on a side contacting the dielectric film,
   wherein the lower barrier layer and the upper barrier layer contain an impurity.

8. The semiconductor device according to claim 7, wherein the impurity is boron or indium, and the concentration of the impurity is 0.01% or higher and 4% or lower.

9. The semiconductor device according to claim 7, wherein the impurity is boron or indium, and the concentration of the impurity is 0.01% or higher and 1% or lower.

* * * * *